(12) United States Patent
Lee et al.

(10) Patent No.: US 10,388,794 B2
(45) Date of Patent: Aug. 20, 2019

(54) DISPLAY DEVICE AND MANUFACTURING METHOD THEREOF

(71) Applicant: SAMSUNG DISPLAY CO., LTD., Yongin-si, Gyeonggi-do (KR)

(72) Inventors: Jong Chan Lee, Suwon-si (KR); Woong Hee Jeong, Seoul (KR); Dae Ho Kim, Daegu (KR); Young Ki Shin, Hwaseong-si (KR); Yoon Ho Khang, Yongin-si (KR); Myoung Geun Cha, Seoul (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 500 days.

(21) Appl. No.: 15/018,058

(22) Filed: Feb. 8, 2016

(65) Prior Publication Data

US 2017/0061883 A1 Mar. 2, 2017

(30) Foreign Application Priority Data

Aug. 27, 2015 (KR) .................. 10-2015-0121092

(51) Int. Cl.
*H01L 27/12* (2006.01)
*G09G 3/3233* (2016.01)
*H01L 29/786* (2006.01)

(52) U.S. Cl.
CPC ..... *H01L 29/78621* (2013.01); *G09G 3/3233* (2013.01); *G09G 2300/0819* (2013.01); *G09G 2300/0842* (2013.01); *G09G 2300/0861* (2013.01); *G09G 2320/0214* (2013.01); *G09G 2320/0233* (2013.01);
(Continued)

(58) Field of Classification Search
CPC ... G09G 2300/0452; G09G 2300/0465; G09G 2300/0819; G09G 2310/0262; H01L 27/3216; H01L 27/3218; H01L 27/3262; H01L 27/3276
See application file for complete search history.

(56) References Cited

U.S. PATENT DOCUMENTS 6,661,057 B1 * 12/2003 Dawson ............ H01L 21/28518
257/336
6,847,080 B2 * 1/2005 Komori ............ H01L 21/26586
257/339
(Continued)

FOREIGN PATENT DOCUMENTS

| KR | 1019970008661 | 2/1997 |
| KR | 1020010014450 | 2/2001 |
| KR | 1020150035132 | 4/2015 |

*Primary Examiner* — Temesghen Ghebretinsae
*Assistant Examiner* — Paras D Karki
(74) *Attorney, Agent, or Firm* — F. Chau & Associates, LLC

(57) ABSTRACT

A display device according to an exemplary embodiment of the present invention includes: a substrate; a plurality of transistors formed on the substrate; and a light-emitting device connected to the plurality of transistors, wherein the transistor includes a gate electrode, the plurality of transistors include a first transistor and a second transistor of which lateral wall slope angles of the gate electrode are different from each other, and the first transistor further includes a doping control member formed on a lateral wall of the gate electrode.

10 Claims, 15 Drawing Sheets

(52) U.S. Cl.
CPC .... *G09G 2320/0238* (2013.01); *H01L 27/124* (2013.01); *H01L 27/1259* (2013.01); *H01L 2227/323* (2013.01)

(56) References Cited

U.S. PATENT DOCUMENTS

| | | | | |
|---|---|---|---|---|
| 2009/0250701 | A1* | 10/2009 | Kimura | H01L 29/66757 257/72 |
| 2014/0034923 | A1* | 2/2014 | Kim | H01L 27/3297 257/40 |
| 2014/0292622 | A1* | 10/2014 | Lee | G09G 3/3233 345/80 |
| 2015/0102430 | A1 | 4/2015 | Hui et al. | |

* cited by examiner

DISPLAY DEVICE AND MANUFACTURING METHOD THEREOF

CROSS-REFERENCE TO RELATED APPLICATION

This application claims priority under 35 U.S.C. § 119 to Korean Patent Application No. 10-2015-0121092 filed on Aug. 27, 2015 in the Korean Intellectual Property Office, the disclosure of which is incorporated by reference herein in its entirety.

TECHNICAL FIELD

The present invention relates to a display device and a manufacturing method thereof.

DISCUSSION OF RELATED ART

In general, as a display device, one such as a liquid crystal display (LCD), an organic light emitting device (organic light emitting diode display, OLED display), and the like are used.

The organic light emitting diode display includes two electrodes and an organic light emitting layer positioned therebetween. Electrons injected from a cathode that is an electrode and holes injected from an anode that is another electrode are combined to each other in the organic light emitting layer to form excitons. Light is emitted when the excitons discharge energy.

SUMMARY

According to an exemplary embodiment of the present invention, a display device is provided as follows. The display device includes a pixel driving circuit and a light-emitting device connected to the pixel driving circuit. The pixel driving circuit includes a first transistor having a first gate electrode and a second transistor having a second gate electrode. A lateral wall slope angle of the first gate electrode is different from a lateral wall slope angle of the second gate electrode. The first transistor further includes a doping control member formed on a lateral wall of the first gate electrode.

According to an exemplary embodiment of the present invention, a method of manufacturing a display device is provided as follows. Transistors including a gate electrode are formed on a substrate. A light-emitting device connected to the transistors is formed. The forming of the transistors includes forming a first gate electrode and a second gate electrode having different lateral wall slope angles on a substrate, forming an insulating layer covering the first gate electrode and the second gate electrode and etching the insulating layer to form a doping control member on a lateral wall of the first gate electrode.

BRIEF DESCRIPTION OF DRAWINGS

These and other features of the present invention will become more apparent by describing in detail exemplary embodiments thereof with reference to the accompanying drawings of which.

DETAILED DESCRIPTION OF EXEMPLARY EMBODIMENTS

Figure 1:
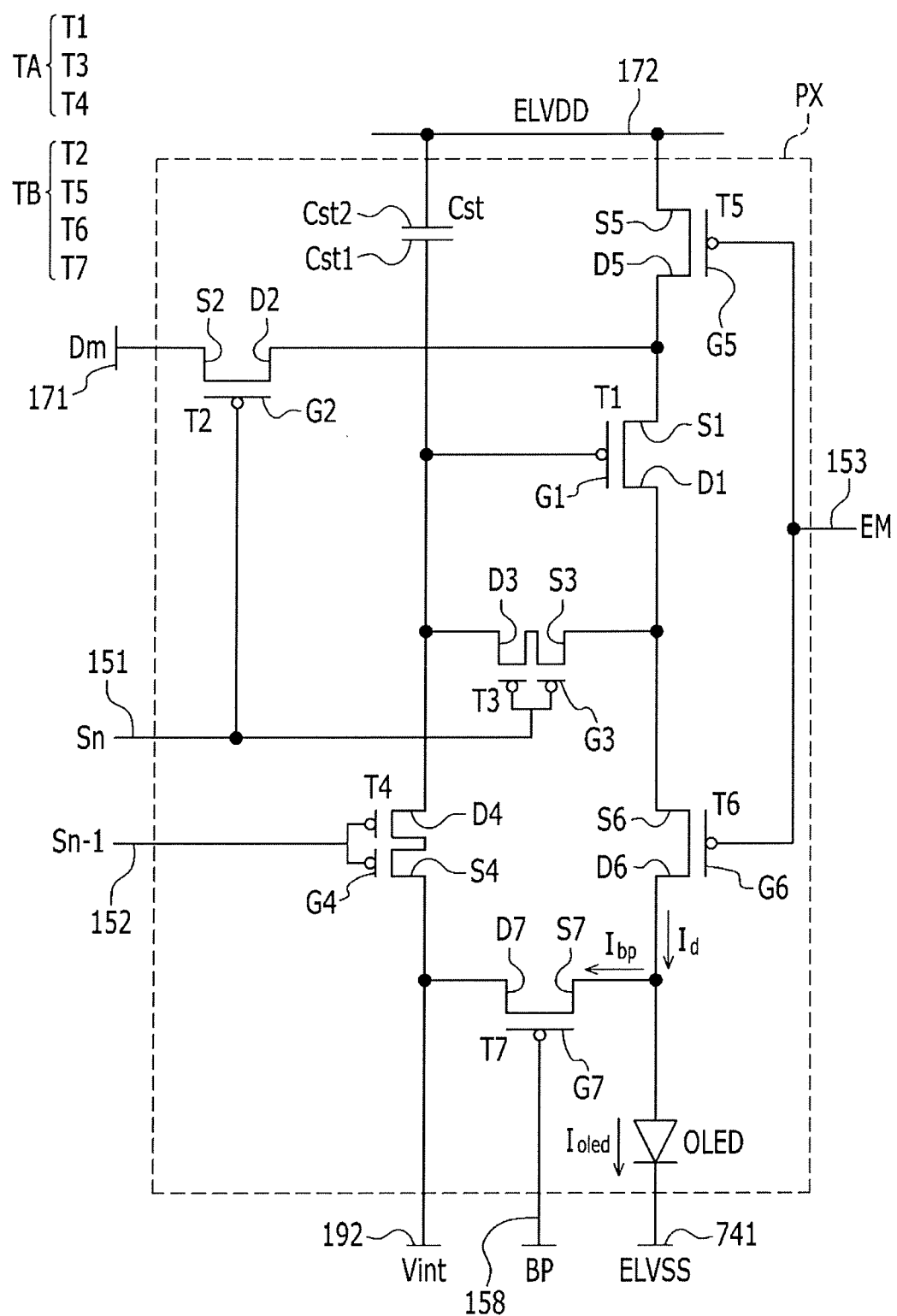
FIG. 1 is an equivalent circuit diagram of one pixel of a display device according to an exemplary embodiment of the present invention.

Exemplary embodiments of the present invention will be described below in detail with reference to the accompanying drawings. However, the present invention may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

Further, since sizes and thicknesses of constituent members shown in the accompanying drawings are arbitrarily given for better understanding and ease of description, the present invention is not limited thereto. In the drawings, the thickness of layers, films, panels, regions, etc., are exaggerated for clarity. In the drawings, for better understanding and ease of description, the thicknesses of some layers and areas are exaggerated.

Also, the present invention is not limited to a number of transistors and capacitors shown in accompanying drawings, and in the display device, each pixel may be provided with a plurality of transistors and at least one capacitor, and may be formed to have various structures by further forming additional wires or omitting existing wires. In this case, the pixel is a minimum unit for displaying an image, and the display device displays the image through the plurality of pixels.

Further, in the specification, the phrase "on a plane" means viewing the object portion from the top, and the phrase "on a cross-section" means viewing a cross-section of which the object portion is vertically cut from the side.

Now, a display device according to an exemplary embodiment of the present invention will be described with reference to accompanying drawings.

FIG. 1 is a circuit diagram of one pixel of a display device according to an exemplary embodiment of the present invention.

As illustrated in FIG. 1, a unit pixel PX of the organic light emitting diode display according to an exemplary embodiment of the present invention includes a pixel driving circuit, and an organic light emitting diode OLED connected to the pixel driving circuit. The pixel driving circuit includes a plurality of signal lines 151, 152, 153, 158, 171, 172, and 192, a plurality of transistors T1, T2, T3, T4, T5, T6, and T7 connected to the plurality of signal lines, and a storage capacitor Cst. In an exemplary embodiment, the unit pixel PX is repeatedly arranged to form a display area. In this case, the signal lines 151, 152, 153, 158, 171, 172 and 192 are also repeatedly connected to the transistors T1 through T7. The transistors T1, T2, T3, T4, T5, T6, and T7 include a first transistor group TA in which the reliability such as the leakage current is the important factor, and a second transistor group TB in which charge mobility related to the reaction speed is the important factor. The first transistor group TA includes a driving transistor T1, a compensation transistor T3, and an initialization transistor T4. The second transistor group TB includes a switching transistor T2, an operation control transistor T5, a light emission control transistor T6, and a bypass transistor T7.

The signal lines 151, 152, 153, 158, 171, 172, and 192 may include a scan line 151, a previous scan line 152, a light emission control line 153, a bypass control line 158, a data line 171, a driving voltage line 172, and an initialization voltage line 192.

The scan line 151 transmits a scan signal Sn, the previous scan line 152 transmit a previous scan signal Sn−1 to the initialization transistor T4, the light emission control line 153 transmits a light emission control signal EM to the operation control transistor T5 and the light emission control transistor T6, and the bypass control line 158 transmits a bypass signal BP to the bypass transistor T7.

The data line 171 crosses the scan line 151, transmitting a data signal Dm. The driving voltage line 172 is substantially parallel to the data line 171 and transmits a driving voltage ELVDD. The initialization voltage line 192 transmits an initialization voltage Vint which is applied to the driving transistor T1 through the initialization transistor T4.

The scan line 151, the previous scan line 152, the light emission control line 153, the bypass control line 158, the data line 171, the driving voltage line 172, and the initialization voltage line 192 are connected to the pixel PX.

A gate electrode G1 of the driving transistor T1 is connected to a first electrode Cst1 of the storage capacitor Cst, a source electrode S1 of the driving transistor T1 is connected to the driving voltage line 172 via the operation control transistor T5, and a drain electrode D1 of the driving transistor T1 is electrically connected to an anode of the organic light emitting diode OLED via the emission control transistor T6. The driving transistor T1 receives the data signal Dm according to a switching operation of the switching transistor T2 to supply a driving current Id to the organic light emitting diode OLED.

A gate electrode G2 of the switching transistor T2 is connected to the scan line 151, a source electrode S2 of the switching transistor T2 is connected to the data line 171, and a drain electrode D2 of the switching transistor T2 is connected to the source electrode S1 of the driving transistor T1. The drain electrode D2 is also connected to the driving voltage line 172 via the operation control transistor T5. The switching transistor T2 is turned on according to the scan signal Sn received through the scan line 151 to perform a switching operation transferring the data signal Dm transferred to the data line 171 to the source electrode S1 of the driving transistor T1.

A gate electrode G3 of the compensation transistor T3 is connected to the scan line 121, a source electrode S3 of the compensation transistor T3 is connected to the drain electrode D1 of the driving transistor T1 and connected to the anode of the organic light emitting diode OLED via the emission control transistor T6, and a drain electrode D3 of the compensation transistor T3 is connected to the first electrode Cst1 of the storage capacitor Cst, the drain electrode D4 of the initialization transistor T4, and the gate electrode C1 of the driving transistor T1. The compensation transistor T3 is turned on according to the scan signal Sn received through the scan line 151 so that the driving transistor T1 is diode-connected by connecting the gate electrode G1 and the drain electrode D1 via the compensation transistor T3.

A gate electrode G4 of the initialization transistor T4 is connected to a previous scan line 152, a source electrode S4 of the initialization transistor T4 is connected to the initialization voltage line 192, and a drain electrode D4 of the initialization transistor T4 is connected to the first electrode Cst1 of the storage capacitor Cst, the drain electrode D3 of the compensation transistor T3, and the gate electrode C1 of the driving transistor T1. The initialization transistor T4 is turned on according to the previous scan signal Sn−1 received through the previous scan line 152 to transfer the initialization voltage Vint to the gate electrode G1 of the driving transistor T1 so that a voltage of the gate electrode G1 of the driving transistor T1 is initialized using the initialization voltage Vint. For example, in response to the previous scan signal Sn−1 applied before application of the scan signal Sn, the gate electrode G1 is applied by the initialization voltage Vint via the initialization transistor T4. In this case, the compensation transistor T3 and the initialization transistor T4 are formed of a dual gate structure transistor to reduce a leakage current through the transistors T3 and T4.

A gate electrode G5 of the operation control transistor T5 is connected to the emission control line 153, a source electrode S5 of the operation control transistor T5 is connected to the driving voltage line 172, and a drain electrode D5 of the operation control transistor T5 is connected to the source electrode S1 of the driving transistor T1 and the drain electrode S2 of the switching transistor T2.

A gate electrode G6 of the emission control transistor T6 is connected to the emission control line 153, a source electrode S6 of the emission control transistor T6 is connected to the drain electrode D1 of the driving transistor T1 and the source electrode S3 of the compensation transistor T3, and a drain electrode D6 of the emission control transistor T6 is connected to the anode of the organic light emitting diode OLED. The operation control transistor T5 and the first emission control transistor T6 are substantially simultaneously turned on according to the emission control signal EM transmitted to the light emission control line 153 such that the driving voltage ELVDD is compensated through the diode-connected driving transistor T1 and is transmitted to the organic light emitting diode OLED.

A gate electrode G7 of the bypass transistor T7 is connected to the bypass control line 158, a source electrode S7 of the bypass transistor T7 is connected to the drain electrode D6 of the light emission control transistor T6 and the anode of the organic light emitting diode OLED, and a drain electrode D7 of the bypass transistor T7 is connected to the initialization voltage line 192 and the source electrode S4 of the initialization transistor T4.

A second electrode Cst2 of the storage capacitor Cst is connected to the driving voltage line 172. A cathode of the organic light emitting diode OLED is connected to a common voltage line 741 transferring a common voltage ELVSS.

The unit pixel PX includes seven transistors T1 to T7 and one capacitor Cst, but the present invention is not limited thereto, and the number of transistors and the number of capacitors may change in an exemplary embodiment.

Next, the detailed structure of a transistor of the first transistor group and a transistor of the second transistor group of the display device shown in FIG. 1 will be described with reference to FIG. 2 and FIG. 3.

Figure 2:
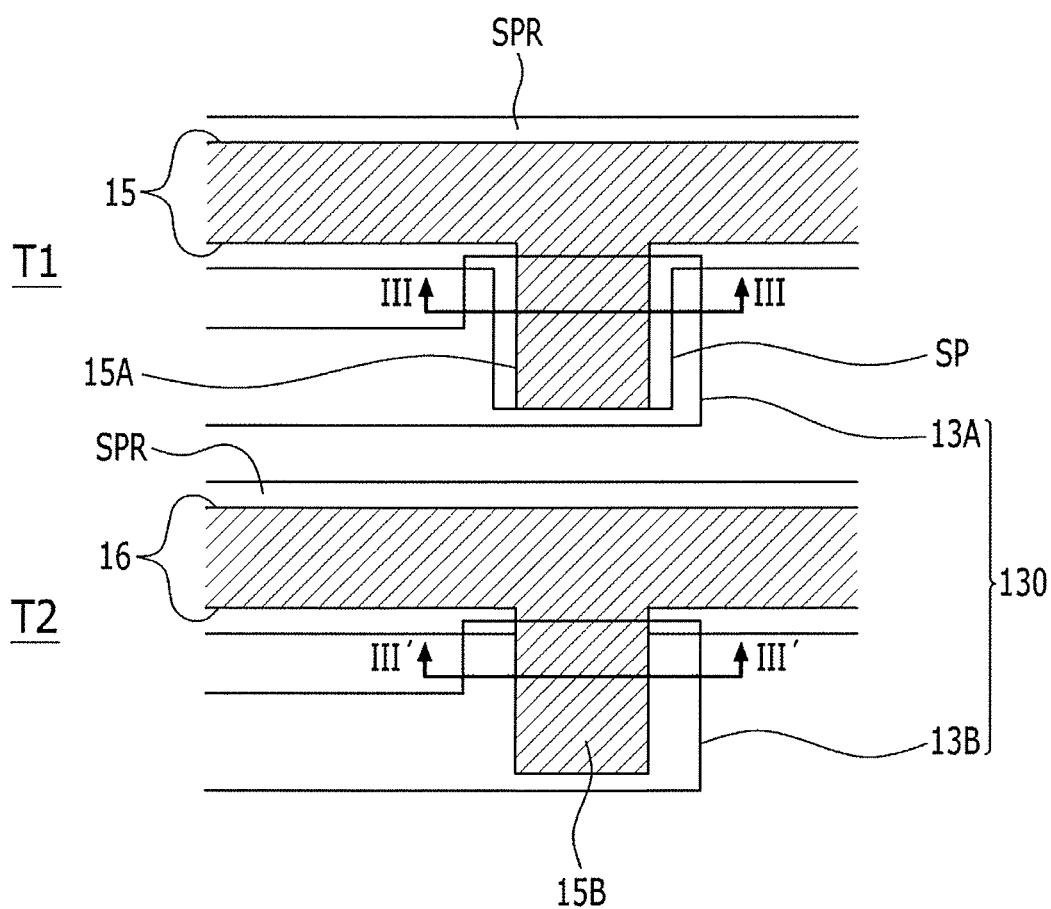
FIG. 2 is a layout view of a first transistor and a second transistor of a display device according to an exemplary embodiment of the present invention.

FIG. 2 shows layouts of the driving transistor T1 and the switching transistor T2 of FIG. 1 according to an exemplary embodiment of the present invention. FIG. 3 are cross-sectional views taken along lines III-III and III'-III' of FIG. 2. The driving transistor T1 is shown as a representative example of the first transistor group TA, and the switching transistor T2 is shown as a representative example of the second transistor group TB.

Figure 3:
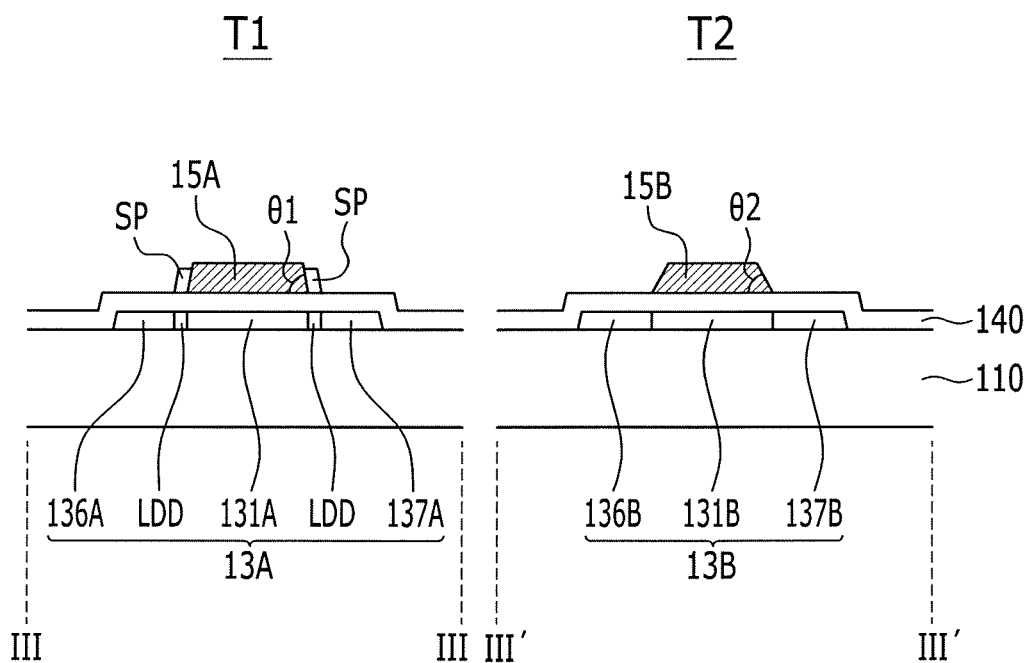
FIG. 3 is a cross-sectional view taken along lines and III'-III' of FIG. 2.

As shown in FIGS. 2 and 3, semiconductor members 13A and 13B are formed on a substrate 110. The first semiconductor member 13A and the second semiconductor member 13B are spaced apart from each other. The first semiconductor members 13A and 13B may be collectively referred to as a semiconductor member 130. The first semiconductor member 13A includes a first channel 131A, a lightly doped drain LDD, a first source electrode 136A, and a first drain electrode 137A. The first source electrode 136A and the first drain electrode 137A are formed on respective sides of the first channel 131A. The lightly doped drain LDD is formed between the first channel 131A and the first source electrode 136A and between the first channel 131A and the first drain electrode 137A. The second semiconductor member 13B includes a second channel 131B, a second source electrode 136B, and a second drain electrode 137B. The second source electrode 136B and the second drain electrode 137B are formed on respective sides of the second channel 131B. A lightly doped drain LDD as formed in the first semiconductor member 13A is not formed in the second semiconductor member 13B.

A gate insulating layer 140 covering the first semiconductor member 13A and the second semiconductor member 13B is formed the substrate 110. A first gate electrode 15A is protruded from a first scan line 15 to overlap a first semiconductor member 13A and a second gate electrode 15B is protruded from a second scan line 16 to overlap a second semiconductor member 13B. The first and the second gate electrodes 15A and 15B are formed on the gate insulating layer 140. The first gate electrode 15A is formed on a first channel 131A, and the second gate electrode 15B is formed on a second channel 131B. A lateral wall of the first gate electrode 15A is inclined, and a first lateral wall slope angle θ1 of the lateral wall of the first gate electrode 15A with respect to the surface of the substrate 110 may range from about 70 degrees to about 90 degrees. The lateral wall of the second gate electrode 15B is inclined and a second lateral wall slope angle θ2 may be less than about 70 degrees. A doping control member SP is formed on each lateral wall of the first gate electrode 15A. The doping control members SP are not separately formed on each lateral wall of the second gate electrode 15B. As described above, since a doping control member SP is formed on each lateral wall of the first gate electrode 15A of the first lateral wall slope angle θ1, the lightly doped drains LDD are formed underneath the doping control members SP. However, since the doping control members SP is not formed on the lateral walls of the second gate electrode 15B having the second lateral wall slope angle θ2 that is lower than the first lateral wall slope angle θ1, the lightly doped drain LDD is not formed.

The first transistor T1 includes the first semiconductor member 13A including the first channel 131A, the first source electrode 136A, and the first drain electrode 137A and the first gate electrode 15A. The second transistor T2 includes the second semiconductor member 13B including the second channel 131B, the second source electrode 136B, and the second drain electrode 137B and the second gate electrode 15B.

A residual insulating layer SPR is formed on the lateral wall of the first scan line 15 and on the lateral wall of the second scan line 16 except for the second gate electrode 15B.

A manufacturing method of the display device according to an exemplary embodiment of the present invention will be described with reference to FIGS. 4, 5, 6, and 7.

Figure 4:
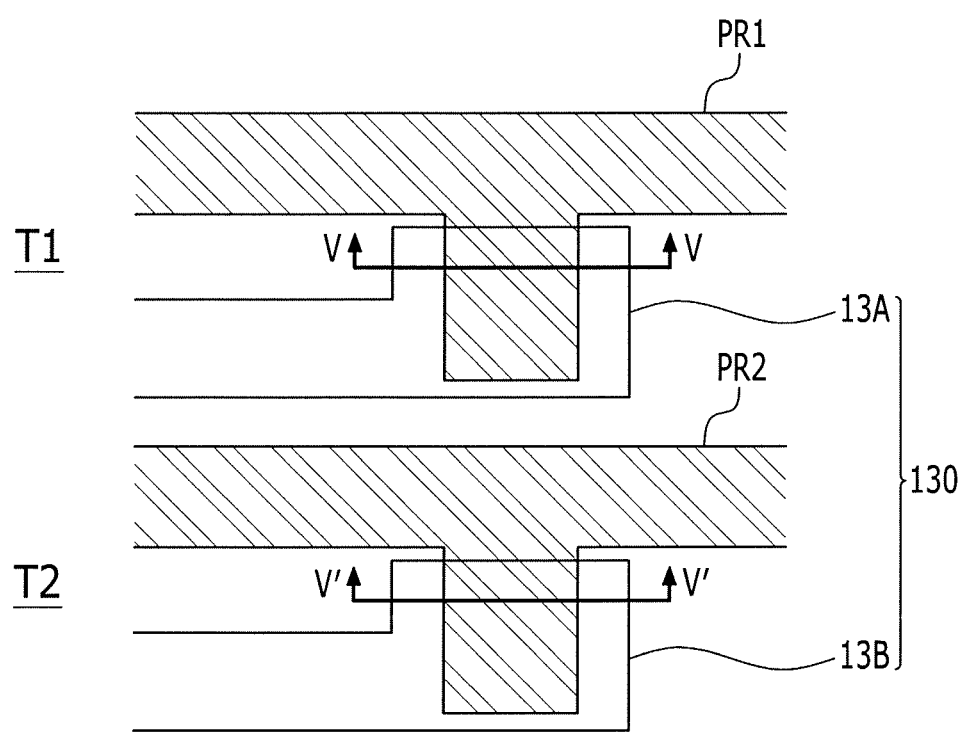
FIG. 4 is a layout view showing one step of a manufacturing method of a display device according to an exemplary embodiment of the present invention.
Figure 5:
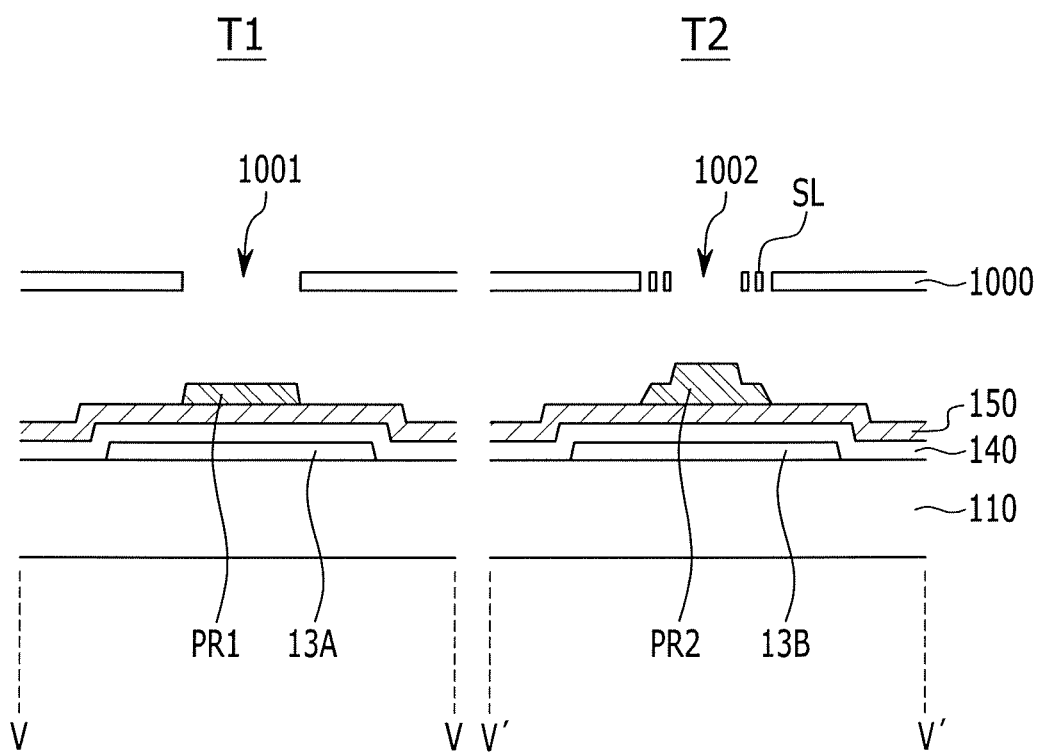
FIG. 5 is a cross-sectional view taken along lines V-V and V'-V' of FIG. 4.
Figure 6:
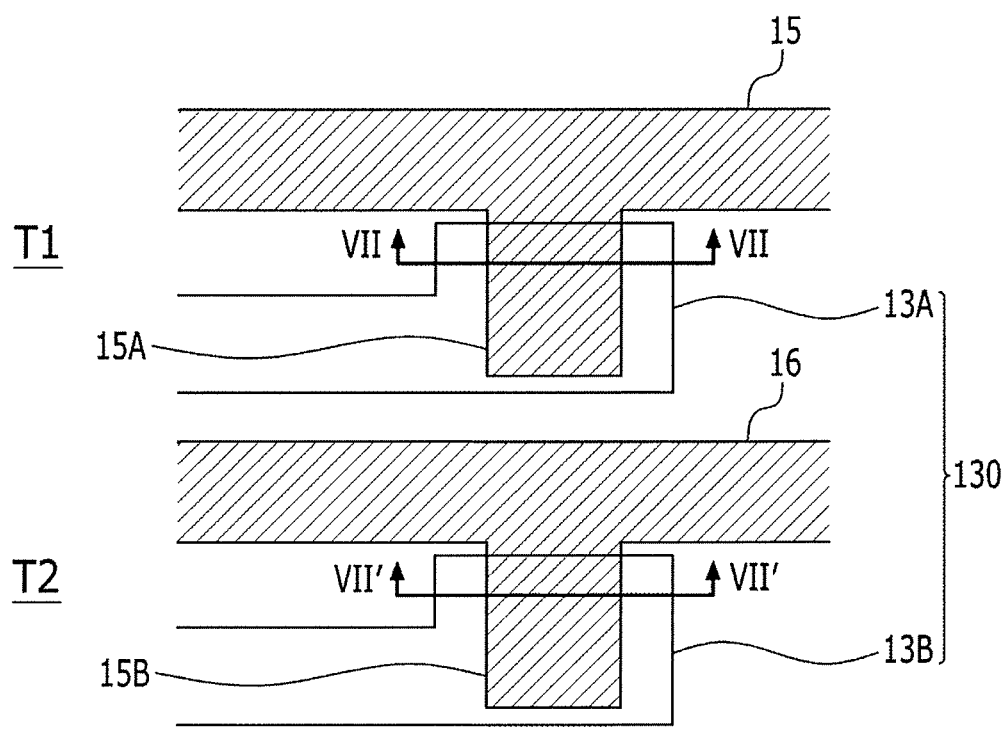
FIG. 6 is a layout view of a following step of FIG. 4.
Figure 7:
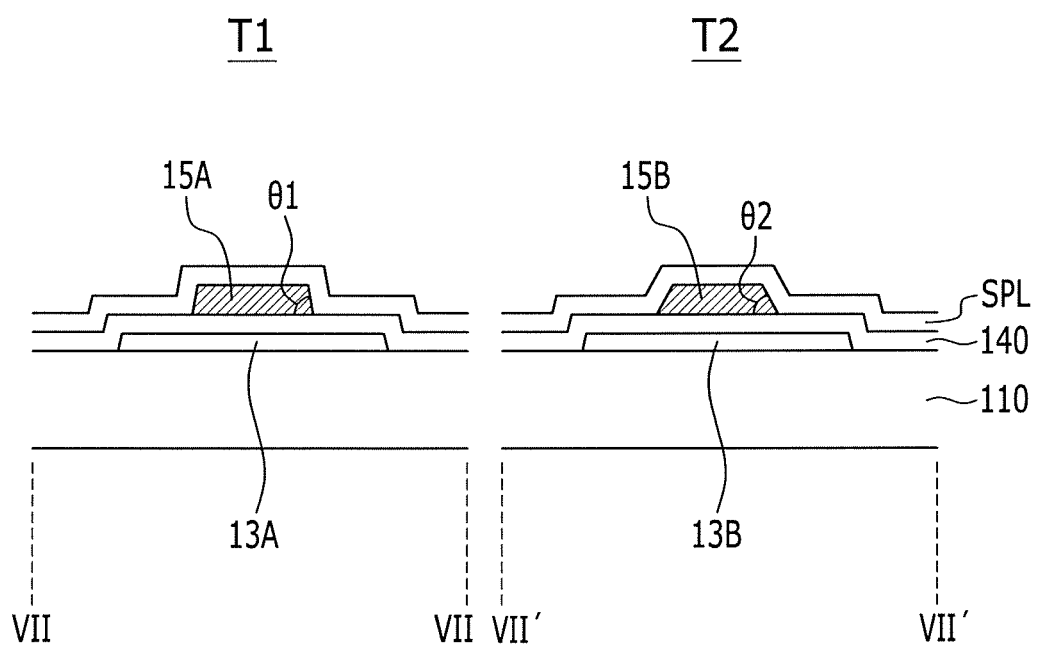
FIG. 7 is a cross-sectional view taken along lines VII-VII and VII'-VII' of FIG. 6.

FIG. 4 shows layouts showing a manufacturing method of a display device according to an exemplary embodiment of the present invention, FIG. 5 shows cross-sectional views taken along lines V-V and V'-V' of FIG. 4, FIG. 6 shows layouts showing a following step of FIG. 4, and FIG. 7 shows cross-sectional views taken along lines VII-VII and VII'-VII' of FIG. 6.

Firstly, as shown in FIGS. 4 and 5, a first semiconductor member 13A and a second semiconductor member 13B are formed on a substrate 110. A gate insulating layer 140 covering the semiconductor members 13A and 13B is formed. A gate metal layer 150 is formed on the gate insulating layer 140. A photosensitive film is formed on the gate metal layer 150. The photosensitive film may be a negative photosensitive film of which an exposed portion remains after a developing process.

The photosensitive film is exposed and developed by using a partial exposure mask 1000 to form a first photosensitive film member PR1 and a second photosensitive film member PR2. In this case, a full opening 1001 of the partial exposure mask 1000 is positioned on the first semiconductor member 13A and a partial opening 1002 having a slit part SL of the partial exposure mask 1000 is positioned on the second semiconductor member 13B. Accordingly, through the exposure and developing process to the photosensitive film, the first photosensitive film member PR1 exposed by the full opening 1001 is formed, and the second photosensitive film member PR2 exposed by the partial opening 1002 is formed. However, the second photosensitive film member PR2 of the position corresponding to the slit part SL of the partial opening 1002 is only partially removed. Accordingly, the lateral wall of the first photosensitive film member PR1 has a steep slope, and the lateral wall of the second photosensitive film member PR2 has a step shape. The partial opening 1002 of the partial exposure mask 1000 has the slit part, but the present invention is not limited thereto, and the partial exposure mask in which the partial opening is formed of a half tone may be used.

Next, as shown in FIGS. 6 and 7, the gate metal layer 150 is etched by using the first photosensitive film member PR1 and the second photosensitive film member PR2 as an etching mask to form a first gate electrode 15A and a second gate electrode 15B. In this case, since the lateral wall of the first photosensitive film member PR1 has the steep slope, the lateral wall of the first gate electrode 15A also has a steep slope. However, the lateral wall of the second photosensitive film member PR2 has the step shape, and the lateral wall of the second gate electrode 15B has a slope less than the steep slope. The first lateral wall slope angle θ1 of the first gate electrode 15A may range between about 70 degrees and about 90 degrees. The second lateral wall slope angle θ2 of the second gate electrode 15B may be less than about 70 degrees. When the first lateral wall slope angle θ1 is less than about 70 degrees or is larger than about 90 degrees, the doping control members SP need not be formed.

Also, an insulating layer SPL covering the first gate electrode 15A and the second gate electrode 15B is formed on the gate insulating layer 140.

Next, as shown in FIGS. 2 and 3, the insulating layer SPL is patterned by being etched by a dry etching method to form the doping control member SP. For example, the insulating layer SPL positioned on the lateral wall of the first gate electrode 15A having the steep slope remains to be the doping control member SP, and the insulating layer SPL positioned on the lateral wall of the second gate electrode 15B is removed. Also, by performing a doping process, a lightly doped drain LDD may be formed underneath the doping control member SP. For example, a portion of the first semiconductor member 13A underneath the doping control member SP is converted to the lightly doped drain LDD by the doping process. In an exemplary embodiment, a first channel 131A is also formed underneath the first gate electrode 15A in the doping process. For example, a portion of the first semiconductor member 13A underneath the first gate electrode 15A is converted to the first channel 131A. In an exemplary embodiment, the lightly doped drain LDD and the first channel 131A are formed at the same time using the same doping process. Since the ion is partially doped in the first semiconductor member 13A at the position corresponding to the control members SP, the lightly doped drain LDD is formed. A first source electrode 136A and a first drain electrode 137A are formed in the first semiconductor member 13A at the position where the doping of the ion is not prevented. As described above, the first channel 131A, the lightly doped drain LDD, the first source electrode 136A, and the first drain electrode 137A are formed to form the first transistor T1 along with the first gate electrode 15A.

Since the ion is doped in the second semiconductor member 13B of the position corresponding to the second gate electrode 15B, the doped second semiconductor member 13B is converted to a second channel 131B under a second gate electrode 15B. A second source electrode 136B and a second drain electrode 137B are formed in the second semiconductor member 13B at the position where the doping of the ion is not prevented. As described above, the second channel 131B, the second source electrode 136B, and the second drain electrode 137B are formed to form the second transistor along with the second gate electrode 15B.

As described above, by forming the first gate electrode 15A and the second gate electrode 15B having the different lateral wall slope angles from each other, the doping control members SP may be formed only on the first gate electrode 15A having the large lateral wall slope angle. Accordingly, without the additional mask, the lightly doped drain LDD is formed in the first transistor T1 formed with the doping control members SP and a lightly doped drain such as the lightly dope drain LDD of the first transistor T1 is prevented from being formed in the second transistor T2. Accordingly, the manufacturing process is simplified and the manufacturing cost is reduced.

In the above, the display device having the first transistor T1 and the second transistor T2 is described. The first (driving) transistor T1 is representative of the first transistor group TA including the compensation transistor T3 and the initialization transistor T4, and thus the other transistors of the first transistor group TA may be similarly formed as described above with reference to the driving transistor T1. The second transistor (switching) T2 is representative of the second transistor group TB including the operation control transistor T5, the light emission control transistor T6, and the bypass transistor T7, and thus the other transistors of the second transistor group TA may be similarly formed as described above with reference to the second transistor.

Next, the detailed structure of the display device shown in FIG. 1 will be described with reference to FIGS. 8, 9, 10, and 11.

Figure 8:
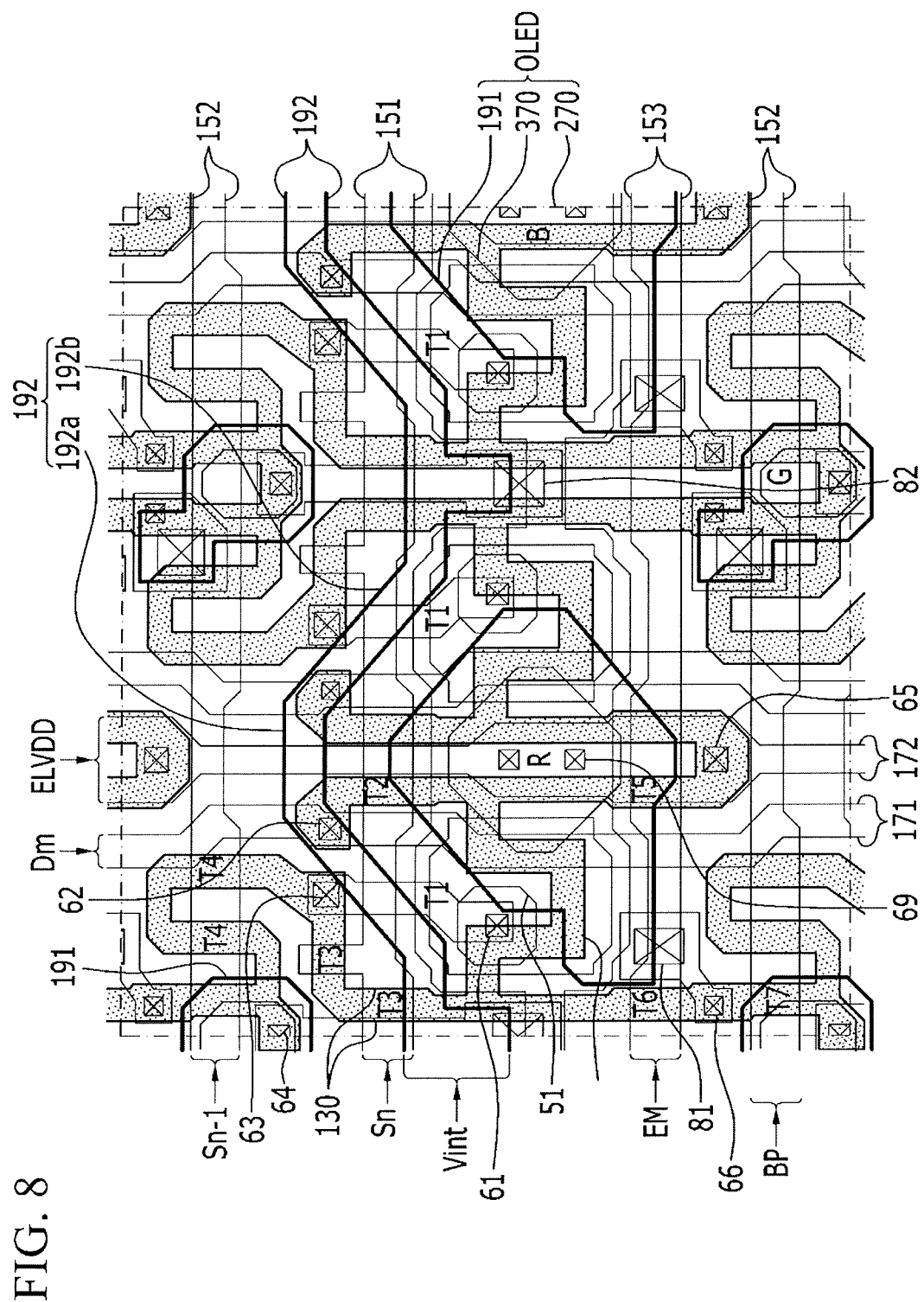
FIG. 8 is a layout view of a plurality of transistors and a capacitor of a display device according to an exemplary embodiment of the present invention.
Figure 9:
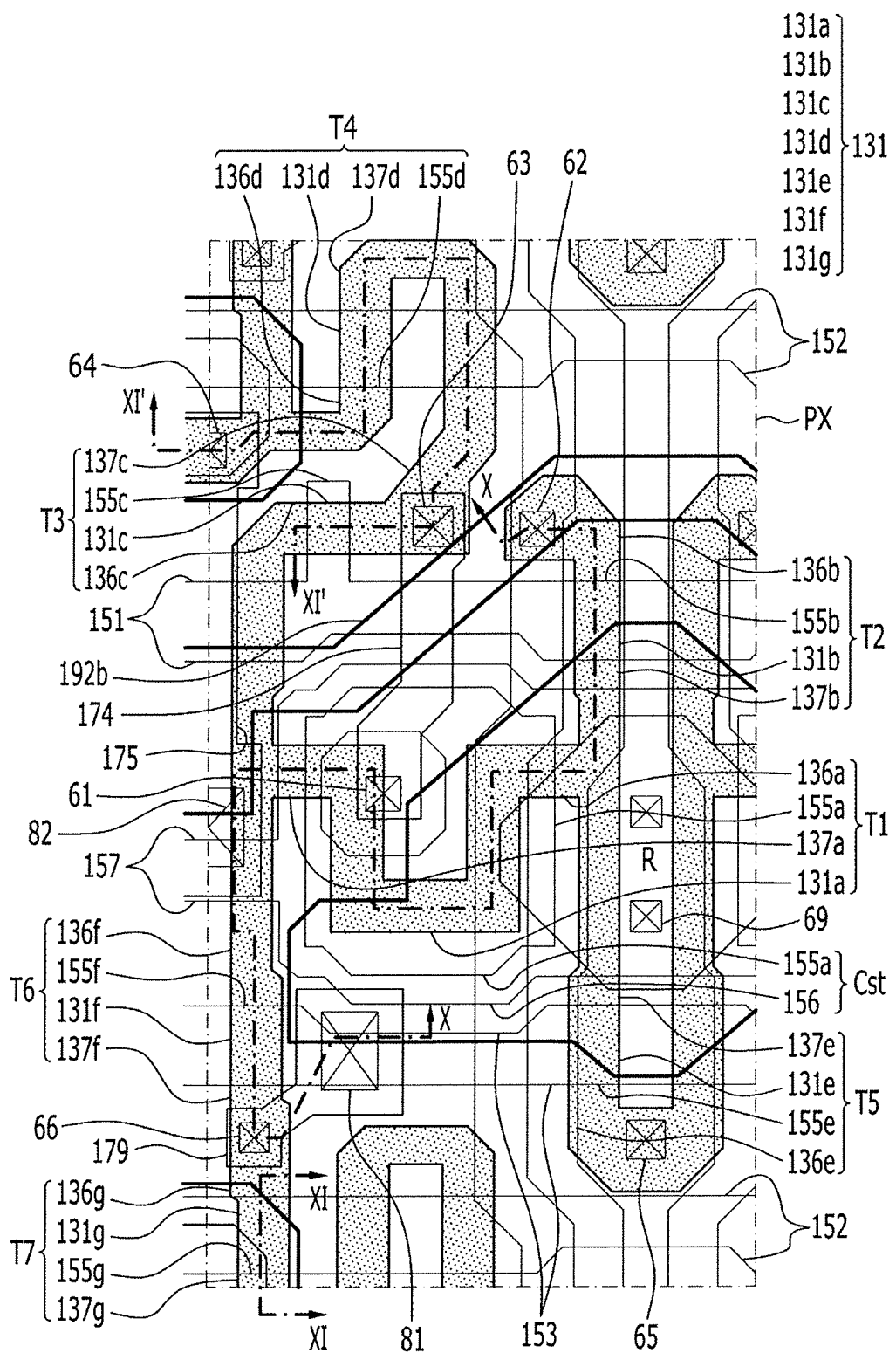
FIG. 9 is a detailed layout view of FIG. 8.
Figure 10:
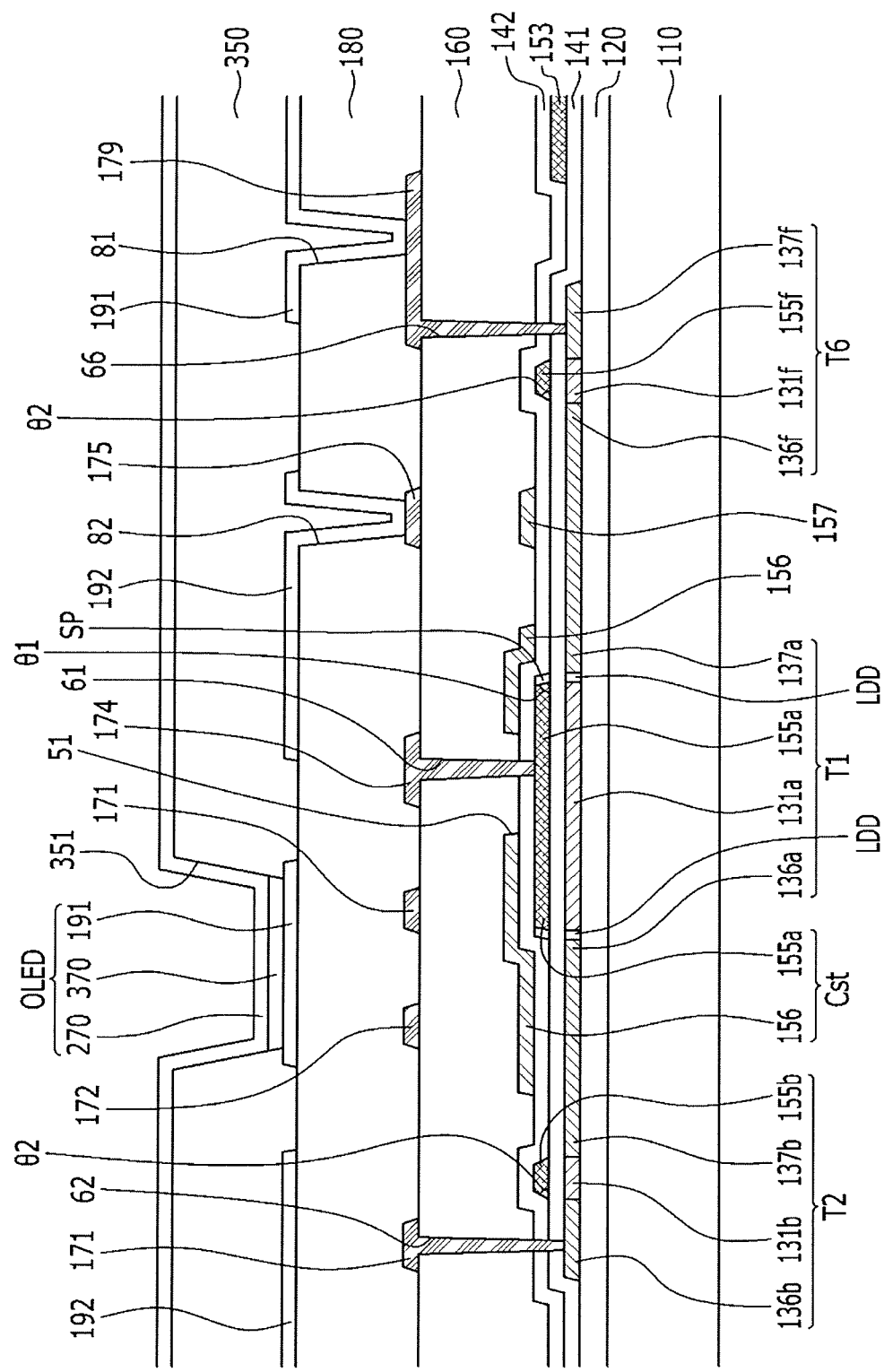
FIG. 10 is a cross-sectional view of the display device of FIG. 9 taken along a line X-X.
Figure 11:
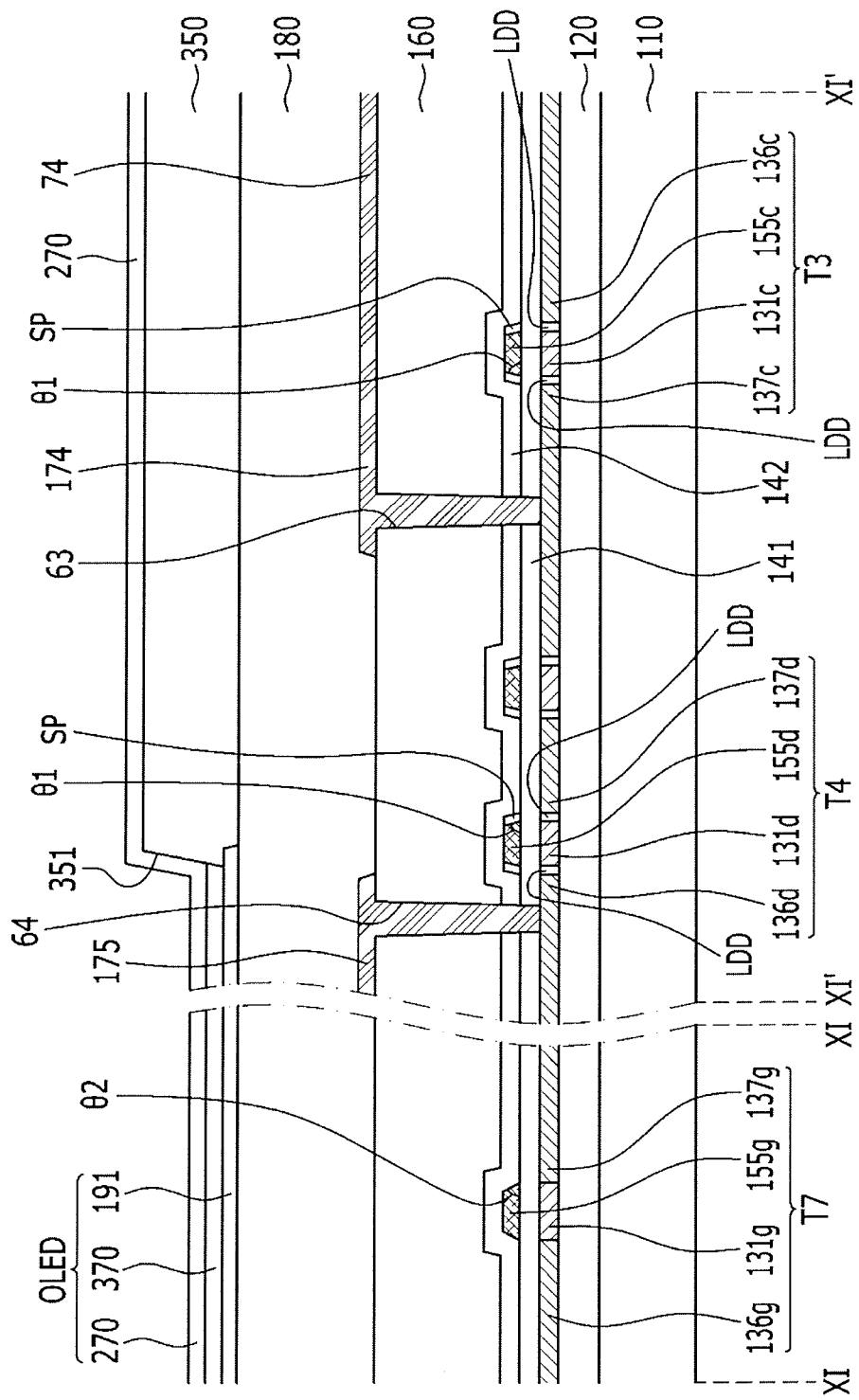
FIG. 11 is a cross-sectional view of the display device of FIG. 9 taken along lines XI-XI and XI'-XI'.

FIG. 8 is a layout of the unit pixel PX of FIG. 1 according to an exemplary embodiment of the present invention, FIG. 9 is a detailed layout view of FIG. 8, FIG. 10 is a cross-sectional view taken along a line X-X of FIG. 9, and FIG. 11 is a cross-sectional view taken along lines XI-XI and XI'-XI' of FIG. 9.

Hereinafter, a detailed planar structure of the display device according to the exemplary embodiment of the present invention will be described in detail with reference to FIGS. 8 and 9, and a detailed cross-sectional structure will be described in detail with reference to FIGS. 10 and 11.

As shown in FIGS. 8 and 9, the unit pixel PX according to an exemplary embodiment of the present invention includes a scan line 151, a previous scan line 152, and a light emission control line 153 respectively applying a scan signal Sn, a previous scan signal Sn−1, and a light emission control signal EM and formed in a row direction. In an exemplary embodiment, the bypass signal BP and the previous scan signal Sn−1 may be supplied in a time-multiplexing manner to the same signal line 152. In an exemplary embodiment, the previous scan signal Sn−1 may also serve as the bypass signal BP. The bypass signal BP may be transmitted through the previous scan line 152.

The unit pixel PX also includes a data line 171, a driving voltage line 172 crossing the scan line 151, the previous scan line 152, and the light emission control line 153 to apply a data signal Dm and a driving voltage ELVDD, respectively.

The initialization voltage Vint is transmitted from the initialization voltage line 192 through the initialization transistor T4 to the compensation transistor T3. The initialization voltage line 192 is formed to a straight portion 192a and an oblique portion 192b which are alternately connected to each other. The straight portion 192a is disposed parallel to the scan line 151, and the oblique portion 192b extends at a predetermined angle with respect to the straight portion 192a.

Also, the driving transistor T1, the switching transistor T2, the compensation transistor T3, the initialization transistor T4, the operation control transistor T5, the light emission control transistor T6, the bypass transistor T7, the storage capacitor Cst, and the organic light emitting diode (OLED) are formed in the pixel PX. The first transistor group TA includes the driving transistor T1, the compensation transistor T3, and the initialization transistor T4. The second transistor TB includes the switching transistor T2, the operation control transistor T5, the light emission control transistor T6, and the bypass transistor T7.

The organic light emitting diode (OLED) is formed of a pixel electrode 191, an organic emission layer 370, and a common electrode 270. In this case, the compensation transistor T3 and the initialization transistor T4 are formed of dual gate transistors to prevent a leakage current.

Each channel of the driving transistor T1, the switching transistor T2, the compensation transistor T3, the initialization transistor T4, the operation control transistor T5, the light emission control transistor T6, and the bypass transistor T7 is formed inside one connected semiconductor member 130 which may be bent in various shapes. The semiconductor member 130 may be formed of polysilicon or an oxide semiconductor material. The oxide semiconductor material may include one of oxides based on titanium (Ti), hafnium (Hf), zirconium (Zr), aluminum (Al), tantalum (Ta), germanium (Ge), zinc (Zn), gallium (Ga), tin (Sn), or indium (In), or zinc oxide (ZnO), indium-gallium-zinc oxide (InGaZnO4), indium zinc oxide (In—Zn—O), zinc-tin oxide (Zn—Sn—O), indium gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium gallium oxide (In—Ge—Ga—O), titanium-indium-zinc oxide (Ti—In—Zn—O), or hafnium-indium-zinc oxide (Hf—In—Zn—O) which are complex oxides thereof. In the case where the semiconductor member 130 is formed of an oxide semiconductor material, an passivation layer for protecting the oxide semiconductor material which is vulnerable to an external environment such as a high temperature may be formed.

The semiconductor member 130 includes a channel which is channel-doped with an N-type impurity or a P-type impurity, and a source doping region and a drain doping region which are formed at respective sides of the channel and have a higher doping concentration than that of the doping impurity which is doped in the channel. The source doping region and the drain doping region may be referred to as the source electrode and the drain electrode, respectively. The source electrode and the drain electrode may be formed in the semiconductor member 130 by a doping process. The doping process may be controlled to be performed in the corresponding regions of the semiconductor member 130 to form the source electrode and the drain electrode. Further, the region between the source electrodes and the drain electrodes of different transistors in the semiconductor member 130 are doped, and thus the source electrodes may be electrically connected to the drain electrodes.

As illustrated in FIG. 9, the channel 131 includes a driving channel 131a which is formed in the driving transistor T1, a switching channel 131b which is formed in the switching transistor T2, a compensation channel 131c which is formed in the compensation transistor T3, an initialization channel 131d which is formed in the initialization transistor T4, an operation control channel 131e which is formed in the operation control transistor T5, a light emission channel 131f which is formed in the light emission control transistor T6, and a bypass channel 131g which is formed in the bypass transistor T7.

The driving transistor T1 includes the driving channel 131a, a driving gate electrode 155a, a driving source electrode 136a, and a driving drain electrode 137a. The driving channel 131a may be curved and may have a meandering shape or a zigzag shape. As such, the driving channel 131a is formed in the curved shape, and a narrow space thereof may be extendedly formed along the driving channel 131a. Therefore, a driving range of the driving gate-source voltage Vgs between the driving gate electrode 155a and the driving source electrode 136a increases by forming the driving channel 131a to be long. Since the driving range of the driving gate-source voltage Vgs increases, it is possible to more delicately control a gray of light emitted from the organic light emitting diode (OLED) by changing a magnitude of the driving gate-source voltage Vgs, thereby increasing a resolution of the organic light emitting diode display and improving display quality. The shape of the driving channel 131a is variously changed, and thus various exemplary embodiments such as 'reverse S', 'S', 'M', 'W', and the like may be possible.

The driving gate electrode 155a overlaps the driving channel 131a, and the driving source electrode 136a and the driving drain electrode 137a are formed on respective sides of the driving channel 131a. The lightly doped drain LDD is formed between the driving channel 131a and the driving source electrode 136a, and the lightly doped drain LDD is also formed between the driving channel 131a and the driving drain electrode 137a. The driving gate electrode 155a is connected to a driving connecting member 174 through a contact hole 61.

The switching transistor T2 includes the switching channel 131b, a switching gate electrode 155b, a switching source electrode 136b, and a switching drain electrode 137b. The switching gate electrode 155b which is a part of the scan line 151 overlaps the switching channel 131b, and the switching source electrode 136b and the switching drain electrode 137b are formed to be adjacent to sides of the switching channel 131b, respectively. The switching source electrode 136b is connected to the data line 171 through a contact hole 62.

The compensation transistor T3 includes the compensation channel 131c, a compensation gate electrode 155c, a compensation source electrode 136c, and a compensation drain electrode 137c. The compensation gate electrode 155c that is a part of the scan line 151 is formed of a dual gate to prevent a leakage current, and overlaps the compensation channel 131c. The compensation source electrode 136c and the compensation drain electrode 137c are formed to be adjacent to sides of the compensation channel 131c, respectively.

The lightly doped drain LDD is formed between the compensation channel 131c and the compensation source electrode 136c, and the lightly doped drain LDD is also formed between the compensation channel 131c and the compensation drain electrode 137c. The compensation drain electrode 137c is connected to a driving connection member 174 through a contact hole 63.

The initialization transistor T4 includes the initialization channel 131d, an initialization gate electrode 155d, an initialization source electrode 136d, and an initialization drain electrode 137*d*. The initialization gate electrode 155*d* that is a part of the previous scan line 152 is formed as two to prevent the leakage current, and overlaps the initialization channel 131*d*. The initialization source electrode 136*d* and the initialization drain electrode 137*d* are formed to be adjacent to sides of the initialization channel 131*d*, respectively.

The lightly doped drain LDD is formed between the initialization channel 131*d* and the initialization source electrode 136*d*, and the lightly doped drain LDD is also formed between the initialization channel 131*d* and the initialization drain electrode 137*d*. The initialization source electrode 136*d* is connected to a second data connecting member 175 through a contact hole 64.

The operation control transistor T5 includes the operation control channel 131*e*, an operation control gate electrode 155*e*, an operation control source electrode 136*e*, and an operation control drain electrode 137*e*. The operation control gate electrode 155*e* that is a part of the light emission control line 153 overlaps the operation control channel 131*e*, and the operation control source electrode 136*e* and the operation control drain electrode 137*e* are formed to be adjacent to respective sides of the operation control channel 131*e*. The operation control source electrode 136*e* is connected to a part that extends from the driving voltage line 172 through a contact hole 65.

The light emission control transistor T6 includes the light emission control channel 131*f*, a light emission control gate electrode 155*f*, a light emission control source electrode 136*f*, and a light emission control drain electrode 137*f*. The light emission control gate electrode 155*f* that is a part of the light emission control line 153 overlaps the light emission control channel 131*f*, and the light emission control source electrode 136*f* and the light emission control drain electrode 137*f* are formed to be adjacent to sides of the light emission control channel 131*f*, respectively. The light emission control drain electrode 137*f* is connected to a third data connecting member 179 through a contact hole 66.

The bypass transistor T7 includes the bypass channel 131*g*, a bypass gate electrode 155*g*, a bypass source electrode 136*g*, and a bypass drain electrode 137*g*. The bypass gate electrode 155*g* that is a part of the previous gate line 152 overlaps the bypass channel 131*g*, and the bypass source electrode 136*g* and the bypass drain electrode 137*g* are formed to be adjacent to sides of the bypass channel 131*g*, respectively.

The bypass source electrode 136*g* is connected directly to the light emission control drain electrode 137*f*, and the bypass drain electrode 137*g* is connected directly to the initialization source electrode 136*d*.

One end of the driving channel 131*a* of the driving transistor T1 is connected to the switching drain electrode 137*b* and the operation control drain electrode 137*e*, and the other end of the driving channel 131*a* is connected to the compensation source electrode 136*c* and the light emission control source electrode 136*f*.

The storage capacitor Cst includes a first storage electrode 155*a* and a second storage electrode 156 disposed via a second gate insulating layer 142 interposed therebetween. The first storage electrode 155*a* corresponds to the driving gate electrode 155*a*, and the second storage electrode 156 as a part extended from a storage line 157 has the wider area than the driving gate electrode 155*a* and covers the entire driving gate electrode 155*a*.

Here, the second gate insulating layer 142 may be formed of a dielectric material, and the storage capacitance is determined by the charge charged in the storage capacitor Cst and the voltage between two storage electrodes 155*a* and 156. As such, the driving gate electrode 155*a* is used as the first storage electrode 155*a*, and as a result, it is possible to ensure a space in which the storage capacitor Cst may be formed within a space narrowed by the driving channel 131*a* having a large area in the pixel.

The first storage electrode 155*a* which is the driving gate electrode 155*a* is connected to one end of the driving connection member 174 through the driving contact hole 61 and a storage opening 51. The storage opening 51 is an opening formed in the second storage electrode 156. Accordingly, the contact hole 61 connecting one end of the driving connection member 174 and the driving gate electrode 155*a* is formed inside the storage opening 51. The driving connection member 174 is formed to be parallel to and at the same layer as the data line 171, and the other end of the driving connection member 174 is connected to the compensation drain electrode 137*c* of the compensation transistor T3 and the initialization drain electrode 137*d* of the initialization transistor T4 through the contact hole 63. Accordingly, the driving connection member 174 connects the driving gate electrode 155*a*, and the compensation drain electrode 137*c* of the compensation transistor T3 and the initialization drain electrode 137*d* of the initialization transistor T4, to each other.

The second storage electrode 156 is connected to the driving voltage line 172 through a contact hole 69. Accordingly, the storage capacitor Cst stores a storage capacitance corresponding to a voltage difference between the driving voltage ELVDD transferred to the second storage electrode 156 through the driving voltage line 172 and the gate voltage Vg of the driving gate electrode 155*a*.

The pixel connecting member 179 is connected to the pixel electrode 191 through a contact hole 81, and the initialization connecting member 175 is connected to the initialization voltage line 192 through a contact hole 82.

Hereinafter, cross-sectional structures of the display device according to the exemplary embodiment of the present invention will be described in detail according to a lamination order with reference to FIGS. 10 and 11.

In this case, since a lamination structure of the operation control transistor T5 is mostly the same as that of the light emission control transistor T6, a detailed description thereof will be omitted.

A buffer layer 120 may be formed on a substrate 110. The substrate 110 may be formed of an insulating material such as glass, crystal, ceramic, or plastic, and the buffer layer 120 serves to block impurities from the substrate 110 during a crystallization process for forming a polycrystalline semiconductor. The buffer layer 120 may reduce defects due to the impurities in the polycrystalline semiconductor and reduce stress applied to the substrate 110.

The semiconductor member 130 including a channel 131 including the driving channel 131*a*, the switching channel 131*b*, the compensation channel 131*c*, the initialization channel 131*d*, the operation control channel 131*e*, the light emission control channel 131*f*, and the bypass channel 131*g* is formed on the buffer layer 120. A driving source electrode 136*a* and a driving drain electrode 137*a* are formed on respective sides of the driving channel 131*a* in the semiconductor member 130, and a switching source electrode 136*b* and a switching drain electrode 137*1*) are formed on respective sides of the switching channel 131*b*. The compensation source electrode 136*c* and the compensation drain electrode 137*c* are formed at respective sides of the compensation channel 131*c*, and the initialization source electrode 136*d* and the initialization drain electrode 137*d* are formed at respective sides of the initialization channel 131*d*. The operation control source electrode 136*e* and the operation control drain electrode 137*e* are formed at respective sides of the operation control channel 131*e*, and the emission control source electrode 136*f* and the emission control drain electrode 137*f* are formed at respective sides of the emission control channel 131*f*. The bypass source electrode 136*g* and the bypass drain electrode 137*g* are formed at respective sides of the bypass channel 131*g*.

In this case, the lightly doped drain LDD is formed between the driving channel 131*a* and the driving source electrode 136*a*, and the lightly doped drain LDD is also formed between the driving channel 131*a* and the driving drain electrode 137*a*. The lightly doped drain LDD is formed between the compensation channel 131*c* and the compensation source electrode 136*c*, and the lightly doped drain LDD is also formed between the compensation channel 131*c* and the compensation drain electrode 137*c*. The lightly doped drain LDD is formed between the initialization channel 131*d* and the initialization source electrode 136*d*, and the lightly doped drain LDD is also formed between the initialization channel 131*d* and the initialization drain electrode 137*d*.

The lightly doped drain LDD may mitigate the sudden electric field change of the driving drain electrode 137*a*, the compensation drain electrode 137*c*, and the initialization drain electrode 137*d* to reduce the leakage current. Accordingly, the reliability of the driving transistor T1, the compensation transistor T3, and the initialization transistor T4 may be increased.

A first gate insulating layer 141 covering the semiconductor member 130 is formed thereon. On the first gate insulating layer 141, a first gate metal line (151, 152, 153, and 155*a*) including a switching gate electrode 155*b*, a scan line 151 including a compensation gate electrode 155*c*, a previous scan line 152 including an initialization gate electrode 155*d* and a bypass gate electrode 155*g*, a light emission control line 153 including an operation control gate electrode 155*e* and a light emission control gate electrode 155*f*, a bypass control line 158, and a driving gate electrode (a first storage electrode) 155*a* is formed.

The first lateral wall slope angle θ1 of the driving gate electrode 155*a* may be more than about 70 degrees to less than about 90 degrees. A doping control member SP is formed on each lateral wall of the driving gate electrode 155*a*. The doping control members SP are formed at the position corresponding to the lightly doped drain LDD to form the lightly doped drain LDD in the semiconductor member.

The second lateral wall slope angle θ2 of the switching gate electrode 155*b* may be less than about 70 degrees. Accordingly, the doping control members SP are not formed on the lateral walls of the switching gate electrode 155*b*.

The first lateral wall slope angle θ1 of the compensation gate electrode 155*c* may be more than about 70 degrees to less than about 90 degrees. A doping control member SP is formed on each lateral wall of the compensation gate electrode 155*c*.

The first lateral wall slope angle θ1 of the initialization gate electrode 155*d* may range between about 70 degrees and about 90 degrees. A doping control member SP is formed on each lateral wall of the initialization gate electrode 155*d*.

The second lateral wall slope angle θ2 of the operation control gate electrode 155*e* may be less than about 70 degrees, the second lateral wall slope angle θ2 of the light emission control gate electrode 155*f* may be about 70 degrees, and the second lateral wall slope angle θ2 of the bypass gate electrode 155*g* may be less than about 70 degrees. Accordingly, the doping control members SP are not all formed on both lateral walls of the operation control gate electrode 155*e*, both lateral walls of the light emission control gate electrode 155*f*, and both lateral walls of the bypass gate electrode 155*g*.

A second gate insulating layer 142 covering the first gate metal line (151, 152, 153, and 155*a*) and the first gate insulating layer 141 is formed thereon. The first gate insulating layer 141 and the second gate insulating layer 142 may be formed of silicon nitride (SiNx) or silicon oxide (SiOx).

A second gate metal line (157 and 156) including a storage line 157 parallel to the scan line 151 and the second storage electrode 156 as an expansion of the storage line 157 is formed on the second gate insulating layer 142.

The second storage electrode 156 is wider than the first storage electrode 155*a* functioning as the driving gate electrode such that the second storage electrode 156 completely covers the driving gate electrode 155*a*.

A gate metal line (151, 152, 153, 155*a*, 156, and 157) including the first gate metal line (151, 152, 153, 155*a*) and the second gate metal line (156 and 157) may be formed as a multilayer in which metal layers stacked on each other are made of copper (Cu), a copper alloy, aluminum (Al), an aluminum alloy, molybdenum (Mo), or a molybdenum alloy.

An interlayer insulating layer 160 is formed on the second gate insulating layer 142 and the second gate metal line (157 and 156). The interlayer insulating layer 160 may be formed of a silicon nitride (SiNx) or a silicon oxide (SiOx).

The interlayer insulating layer 160 has contact holes 61, 62, 63, 64, 65, 66, and 69. On the interlayer insulating layer 160, a data metal line (171, 172, 174, 175, and 179) including a data line 171, a driving voltage line 172, a driving connecting member 174, an initialization connecting member 175, and a pixel connecting member 179 is formed. The data metal line (171, 172, 174, 175, and 179) may be formed as a multilayer including metal layers including copper (Cu), a copper alloy, aluminum (Al), an aluminum alloy, molybdenum (Mo), or a molybdenum alloy, and for example, may be formed as a triple layer of titanium/aluminum/titanium (Ti/Al/Ti), a triple layer of molybdenum/aluminum/molybdenum (Mo/Al/Mo), or a triple layer of molybdenum/copper/molybdenum (Mo/Cu/Mo).

The data line 171 is connected to the switching source electrode 136*b* through the contact hole 62 formed in the first gate insulating layer 141, the second gate insulating layer 142, and the interlayer insulating layer 160, one end of the driving connecting member 174 is connected to the first storage electrode 155*a* through the contact hole 61 formed in the second gate insulating layer 142 and the interlayer insulating layer 160, and the other end of the driving connecting member 174 is connected to the compensation drain electrode 137*c* and the initialization drain electrode 137*d* through the contact hole 63 formed in the first gate insulating layer 141, the second gate insulating layer 142, and the interlayer insulating layer 160.

The initialization connecting member 175 parallel to the data line 171 is connected to the initialization source electrode 136*d* through the contact hole 64 formed in the first gate insulating layer 141, the second gate insulating layer 142, and the interlayer insulating layer 160. Also, the pixel connecting member 179 is connected to the light emission control drain electrode 137*f* through the contact hole 66 formed in the first gate insulating layer 141, the second gate insulating layer 142, and the interlayer insulating layer 160.

A passivation layer 180 covering the data metal line (171, 172, 174, 175, and 179) and the interlayer insulating layer 160 is formed thereon. The passivation layer 180 covers the data metal line (171, 172, 174, 175, and 179) to be flattened such that the pixel electrode 191 may be formed on the passivation layer 180 without a step. The passivation layer 180 may be formed of a stacked layer of an organic material such as a polyacrylate resin, a polyimide resin, or the like, or a stacked layer of an organic material and an inorganic material.

The pixel electrode 191 and the initialization voltage line 192 are formed on the passivation layer 180. The pixel connecting member 179 is connected to the pixel electrode 191 through the contact hole 81 formed in the passivation layer 180, and the initialization connecting member 175 is connected to the initialization voltage line 192 through the contact hole 82 formed in the passivation layer 180.

A pixel definition layer (PDL) 350 covering the passivation layer 180, the initialization voltage line 192, and the edge of the pixel electrode 191 is formed thereon, and the pixel definition layer 350 has a pixel opening 351 exposing the pixel electrode 191. The pixel definition layer 350 may be made of organic materials such as a polyacrylate resin, a polyimide resin, and the like, and silica-based organic materials.

An organic emission layer 370 is formed on the pixel electrode 191 exposed through the pixel opening 351, and a common electrode 270 is formed on the organic emission layer 370. The common electrode 270 is also formed on the pixel definition layer 350 over the plurality of pixels PX. As such, the organic light emitting diode (OLD) including the pixel electrode 191, the organic emission layer 370, and the common electrode 270 is formed.

Here, the pixel electrode 191 is an anode which is a hole injection electrode, and the common electrode 270 is a cathode which is an electron injection electrode. However, the exemplary embodiment according to the present invention is not limited thereto, and the pixel electrode 191 may be the cathode and the common electrode 270 may be the anode according to a driving method of the display device. Holes and electrons are injected into the organic emission layer 370 from the pixel electrode 191 and the common electrode 270, respectively, and excitons acquired by combining the injected holes and electrons fall from an excitation state to a ground state, thereby emitting light.

The organic emission layer 370 is made of a low-molecular organic material or a high-molecular organic material such as poly(3,4-ethylenedioxythiophene) (PEDOT). Further, the organic emission layer 370 may be formed with multiple layers including at least one of an emission layer, a hole injection layer (HIL), a hole transporting layer (HTL), an electron transporting layer (ETL), and an electron injection layer (EIL). When the organic emission layer 370 includes all of the layers, the hole injection layer is disposed on the pixel electrode 191 which is the positive electrode, and the hole transporting layer, the light emission layer, the electron transporting layer, and the electron injection layer are sequentially laminated thereon.

The organic emission layer 370 may include a red organic emission layer emitting red light, a green organic emission layer emitting green light, and a blue organic emission layer emitting blue light, and the red organic emission layer, the green organic emission layer, and the blue organic emission layer are formed at a red pixel, a green pixel, and a blue pixel, respectively, to implement color images.

Further, in the organic emission layer 370, all of the red organic emission layer, the green organic emission layer, and the blue organic emission layer are laminated together on the red pixel, the green pixel, and the blue pixel, and a red color filter, a green color filter, and a blue color filter are formed for each pixel to implement the color images. As another example, a white organic emission layer emitting white light is formed on all of the red pixel, the green pixel, and the blue pixel, and the red color filter, the green color filter, and the blue color filter are formed for each pixel to implement the color images. When the color images are implemented by using the white organic emission layer and the color filters, a deposition mask for depositing the red organic emission layer, the green organic emission layer, and the blue organic emission layer on individual pixels, that is, the red pixel, the green pixel, and the blue pixel, respectively, may not be used.

The white organic emission layer described in an exemplary embodiment may be formed by one organic emission layer, and includes a configuration that may emit white light by laminating a plurality of organic emission layers. In an exemplary embodiment, the white organic emission layer may include a configuration that enables the white light to be emitted by combining at least one yellow organic emission layer and at least one blue organic emission layer, a configuration that enables the white light to be emitted by combining at least one cyan organic emission layer and at least one red organic emission layer, a configuration that enables the white light to be emitted by combining at least one magenta organic emission layer and at least one green organic emission layer, and the like.

An encapsulation member (not shown) protecting the organic light emitting diode OLD may be formed on the common electrode 270, and the encapsulation member may be sealed to the substrate 110 by a sealant and may be formed of various materials such as glass, quartz, ceramic, plastic, and a metal. A thin film encapsulation layer may be formed on the common electrode 270 by depositing the inorganic layer and the organic layer without the usage of the sealant.

A manufacturing method of the display device according to an exemplary embodiment of the present invention will now be described in detail with reference to FIGS. 12, 13, 14, and 15.

Figure 12:
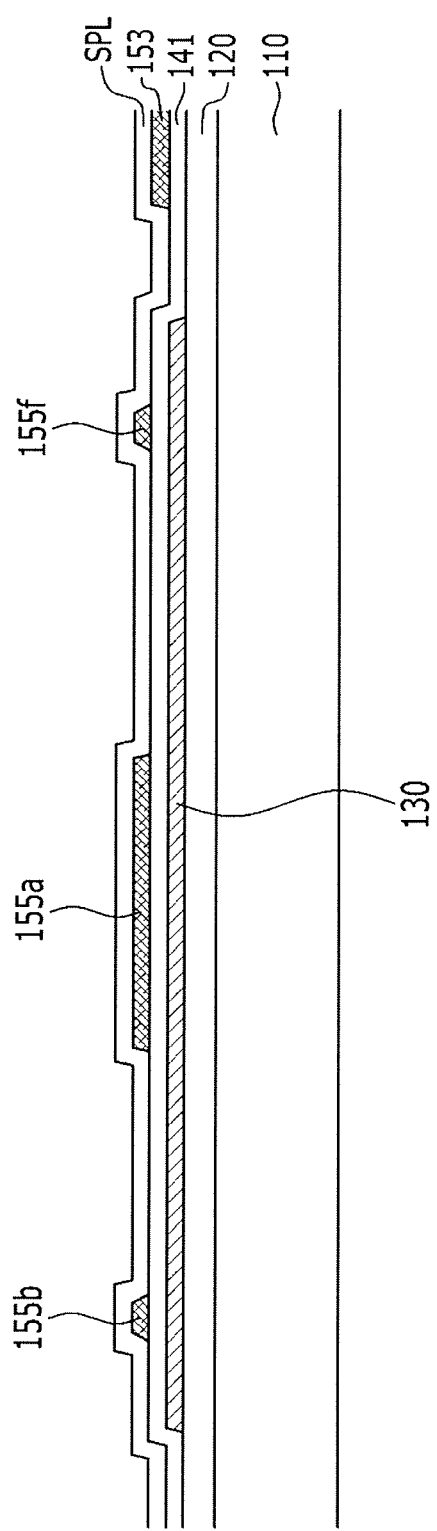
FIG. 12 is a cross-sectional view, taken along line X-X of FIG. 9, showing a manufacturing method of a display device according to an exemplary embodiment of the present invention.
Figure 13:
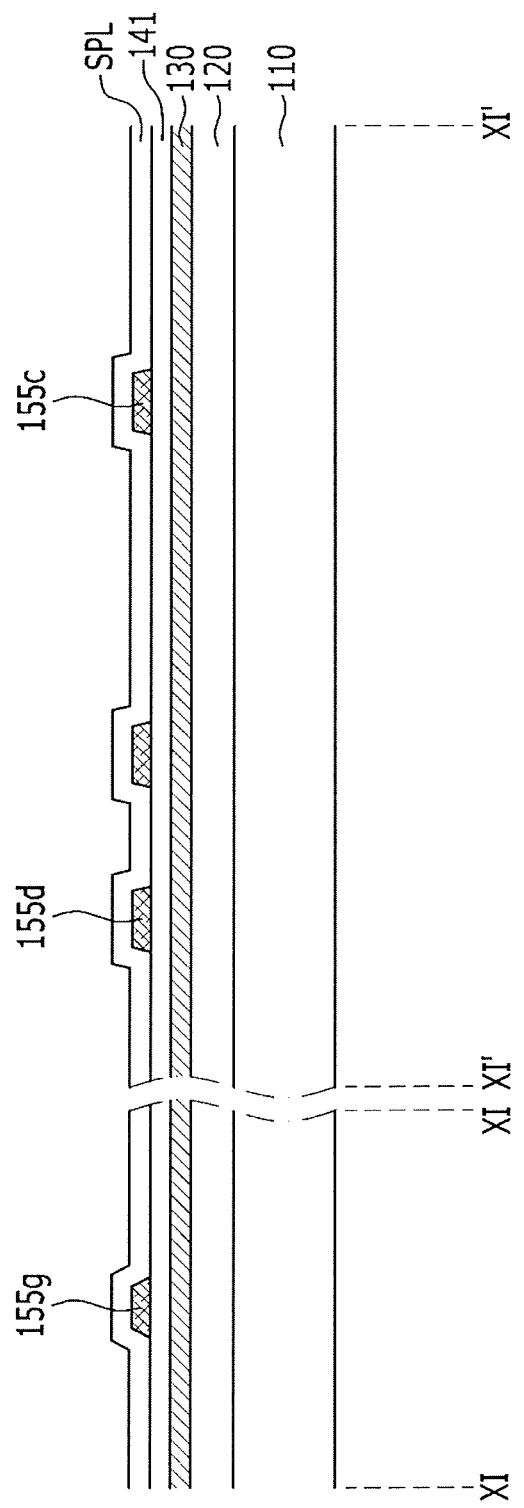
FIG. 13 is a cross-sectional view, taken along lines XI-XI and XI-XI' of FIG. 9, showing a manufacturing method of a display device according to an exemplary embodiment.
Figure 14:
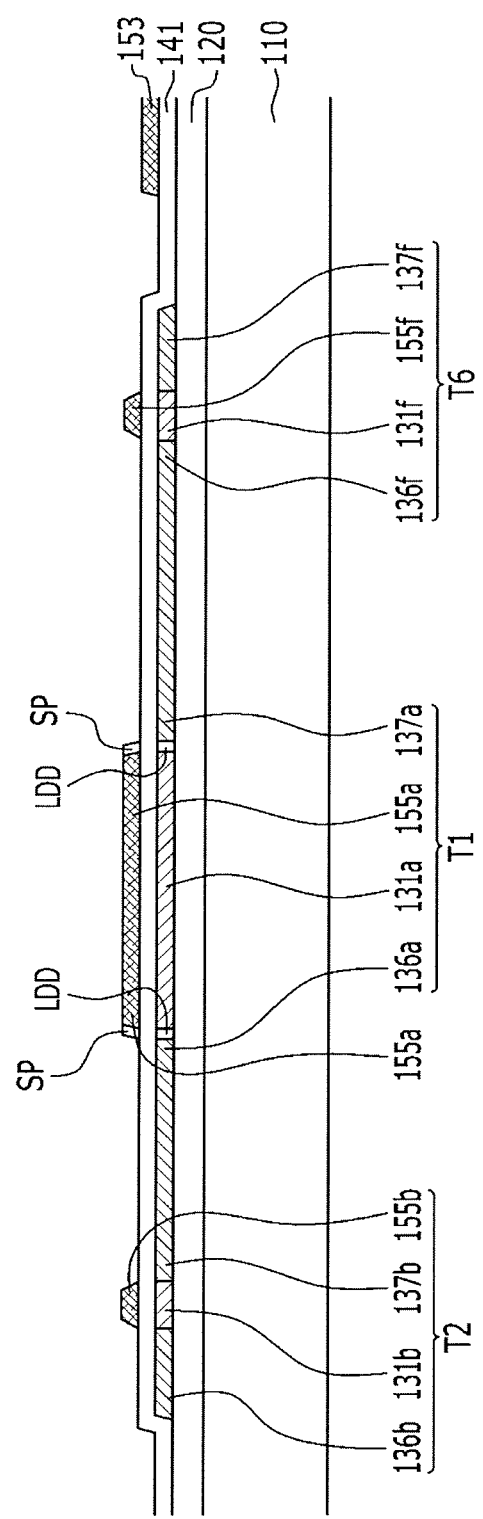
FIG. 14 is a cross-sectional view, taken line X-X of FIG. 9, showing a manufacturing method of a display device according to an exemplary embodiment of the present invention.
Figure 15:
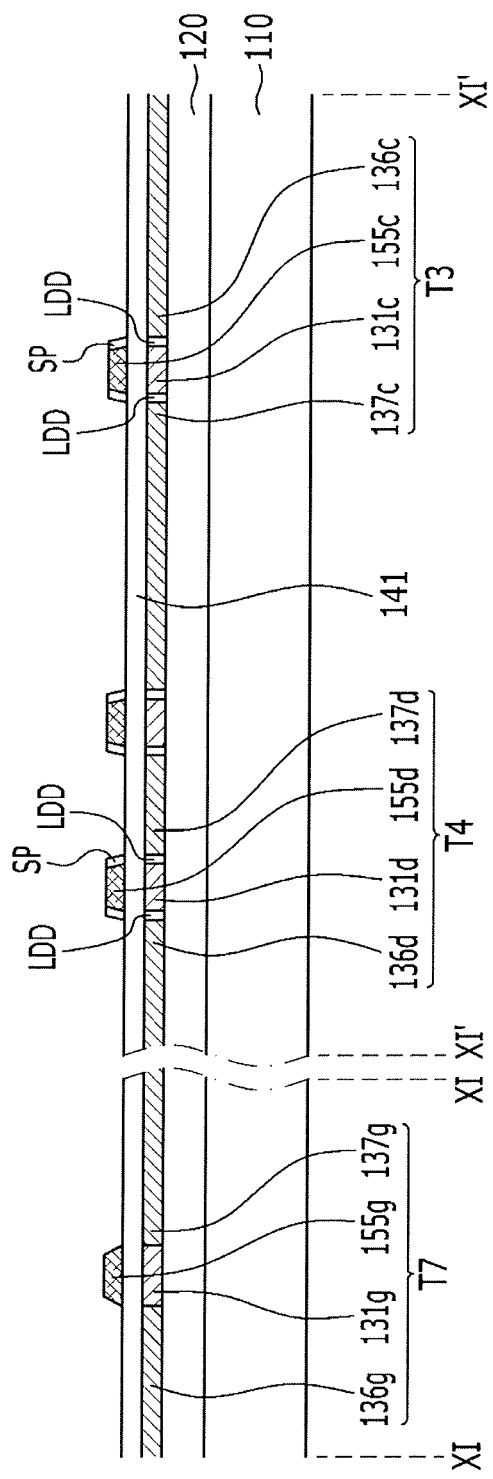
FIG. 15 is a cross-sectional, taken along lines XI-XI and XI'-XI' of FIG. 9, showing a manufacturing of a display device according to an exemplary embodiment of the present invention.

FIG. 12 is a cross-sectional view showing one step of a manufacturing method of a display device according to an exemplary embodiment of the present invention as a cross-sectional view taken along line X-X of the display device of FIG. 9, FIG. 13 is a cross-sectional view showing the same step as FIG. 12 as a cross-sectional view of the display device of FIG. 9 taken along lines XI-XI and XI'-XI', FIG. 14 is a cross-sectional view of a following step of FIG. 12 as a cross-sectional view taken along line X-X of the display device of FIG. 9, and FIG. 15 is a cross-sectional view of the same step as FIG. 14 as a cross-sectional view of the display device of FIG. 9 taken along lines XI-XI and XI'-XI'.

First, as illustrated in FIGS. 12 and 13, the buffer layer 120 is formed on the substrate 110. The buffer layer 120 may be formed of a single layer of a silicon nitride or a laminate layer of a silicon nitride and a silicon oxide, and is deposited on an entire surface of the substrate 110 by a method such as plasma enhanced chemical vapor deposition (PECVD). In addition, the semiconductor layer 131 is formed on the buffer layer 120. The semiconductor layer 131 may be formed of polysilicon or an oxide semiconductor, and the polysilicon may be formed by a method of forming an amorphous silicon layer and then crystallizing the layer. Various crystallizing methods may be applied. For example, the amorphous silicon layer may be crystallized by using heat, a laser, Joule heat, an electric field, a catalyst metal, or the like. In this case, the semiconductor layer is in an intrinsic semiconductor state in which an impurity is not doped. Further, the semiconductor layer is patterned into the semiconductor member 130 having the form illustrated in FIG. 7 by performing a photolithography process using a first mask on the semiconductor layer. In this case, the semiconductor member 130 is not doped, so that the semiconductor member 130 is not divided into the channel, the source electrode, and the drain electrode configuring each transistor. Further, the semiconductor 130 is made to be in an impurity semiconductor state by performing channel doping with a low doping concentration on the semiconductor 130.

Further, the first gate insulating layer 141 covering the buffer layer 120 and the semiconductor layer 130 is formed thereon. The first gate insulating layer 141 is formed by depositing silicon nitride (SiNx) or silicon oxide (SiOx) on a front surface thereof by a method of plasma enhanced chemical vapor deposition (PECVD) and the like. In addition, a first gate metal layer is formed on the first gate insulating layer 141. The first gate metal layer may be formed of a multilayer in which metal layers are formed of copper (Cu), a copper alloy, aluminum (Al), an aluminum alloy, molybdenum (Mo), or a molybdenum alloy and are stacked on each other. In addition, the first gate metal layer is patterned by a photolithography process using a second mask. As a result, the first gate metal line (151, 152, 153, and 155*a*) including the scan line 151, the previous scan line 152, the light emission control line 153, and the first storage electrode 155*a* of the driving gate electrode is formed. In this case, since the second mask is a partial exposure mask, the lateral wall of the switching gate electrode 155*b* that is the part of the scan line 151 may be formed to be smooth. Also, the lateral wall of the bypass gate electrode 155*g* that is the part of the previous scan line 152 may be formed to be smooth, and the lateral wall of the operation control gate electrode 155*e* and the light emission control gate electrode 155*f* that are the part of the light emission control line 153 may be formed to be smooth. The second lateral wall slope angle θ2 of the switching gate electrode 155*b* may be formed to be less than about 70 degrees, and the second lateral wall slope angle θ2 of the operation control gate electrode 155*e*, the second lateral wall slope angle θ2 of the light emission control gate electrode 155*f*, and the second lateral wall slope angle θ2 of the bypass gate electrode 155*g* may be formed to be about 70 degrees.

In contrast, the lateral wall of the driving gate electrode 155*a*, the lateral wall of the compensation gate electrode 155*c*, and the lateral wall of the initialization gate electrode 155*d* are formed to have the relatively steep slope.

The first lateral wall slope angle θ1 of the driving gate electrode 155*a*, the first lateral wall slope angle θ1 of the compensation gate electrode 155*c*, and the first lateral wall slope angle θ1 of the initialization gate electrode 155*d* may be formed to be more than about 70 degrees to less than about 90 degrees.

Also, the insulating layer SPL covering the first gate metal line (151, 152, 153, 155*a*) is formed.

Next, as shown in FIGS. 14 and 15, the insulating layer SPL is wholly etched by the dry etching method. Accordingly, the insulating layer SPL positioned on the lateral wall of the first gate electrode 15A including the driving gate electrode 155*a*, the compensation gate electrode 155*c*, and the initialization gate electrode 155*d* having the steep slope remains to be the doping control member SP. The insulating layer SPL positioned on the lateral wall of the second gate electrode 15B including the switching gate electrode 155*b*, the operation control gate electrode 155*e*, the light emission control gate electrode 155*f*, and the bypass gate electrode 155*g* having the smooth slope is removed.

Further, source and drain doping to have a higher doping concentration than that of the channel doping is performed on the semiconductor member 130. Exposed areas of the semiconductor member 130 are source and drain doped except for the parts hidden by the switching gate electrode 155*b*, the compensation gate electrode 155*c*, the initialization gate electrode 155*d*, the operation control gate electrode 155*e*, the light emission control gate electrode. As a result, the source electrode and the drain electrode of each transistor are formed. The channel 131 of each transistor is formed in the area of the semiconductor 130 which is hidden and is not doped. That is, the driving channel 131*a*, the switching channel 131*b*, the compensation channel 131*c*, the initialization channel 131*d*, the operation control channel 131*e*, the light emission control channel 131*f*, and the bypass channel 131*g* are simultaneously formed. Also, the lightly doped drain LDD is formed in the semiconductor member of the position corresponding to the doping control members SP is formed.

As described above, by only forming the doping control members SP and the lightly doped drain LDD in the first transistor including the first gate electrode 15A, the lightly doped drain LDD may be selectively formed. As such, without the addition of the separate mask, the lightly doped drain LDD is formed in the first transistor and the lightly doped drain LDD may not be formed in the second transistor. Accordingly, the manufacturing process is simplified and the manufacturing cost is reduced.

Next, as shown in FIGS. 10 and 11, the second gate insulating layer 142 covering the first gate insulating layer 141 and the first gate metal line (151, 152, 153, and 155*a*) is formed thereon. The second gate insulating layer 142 is formed by depositing silicon nitride (SiNx) or silicon oxide (SiOx) on a front surface thereof by a method of plasma enhanced chemical vapor deposition (PECVD) and the like.

Also, the second gate metal layer is formed on the second gate insulating layer 142. The second gate metal layer may be formed in a multilayer in which metal layers are made of copper (Cu), a copper alloy, aluminum (Al), an aluminum alloy, molybdenum (Mo), or a molybdenum alloy and are stacked on each other. The second gate metal layer is etched by the photolithography process by using a third mask. As a result, the second gate metal line (157 and 156) including the storage line 157 and the second storage electrode 156 is formed.

Also, the interlayer insulating layer covering the second gate insulating layer 142 and the second gate metal line (157 and 156) is formed thereof. Also, the plurality of contact holes 61, 62, 63, 64, 65, 66, and 69 are simultaneously formed by simultaneously pattering the first gate insulating layer 141, the second gate insulating layer 142, and the interlayer insulating layer 160 by a photolithography process using a fourth mask.

Next, a data metal layer is formed on the interlayer insulating layer 160. The data metal layer may be formed of a multilayer in which a metal layer including any one of copper, a copper alloy, aluminum, an aluminum alloy, molybdenum, and a molybdenum alloy is stacked. For example, the data metal layer may be formed of triple layers of titanium/aluminum/titanium (Ti/Al/Ti), molybdenum/aluminum/molybdenum (Mo/Al/Mo), or molybdenum/copper/molybdenum (Mo/Cu/Mo).

The data metal layer is patterned by a photolithography process using a fifth mask. Accordingly, a data metal line (171, 172, 174, and 179) including the data line 171, the driving voltage line 172, the driving connecting member 174, and the pixel connecting member 179 is formed on the interlayer insulating layer 160.

Also, the passivation layer 180 covering the interlayer insulating layer 160 and the data metal line (171, 172, 174, and 179) is formed and a contact hole 81 is formed in the passivation layer 180 by the photolithography process using a sixth mask. Further, a pixel electrode layer is formed on the passivation layer 180 and is etched by the photolithography process using a seventh mask. Accordingly, the pixel electrode 191 connected to the pixel connecting member 179 through the contact hole 81 is formed on the passivation layer 180. Then, the pixel definition layer 350 covering the pixel electrode 191 is formed on the protective layer 180, and the pixel opening 351 for exposing a portion of the pixel electrode 191 is formed in the pixel definition layer 350 by using an eighth mask. Then, the organic light emission layer 370 is formed on the pixel electrode 191 exposed through the pixel opening 351 of the pixel definition layer 350. Also, the common electrode 270 is formed on the organic emission layer 370 to complete the organic light emitting diode (OLED). The common electrode 270 is formed over the entire area including an upper portion of the pixel definition layer 350, so that a separate mask is not used.

While the present invention has been shown and described with reference to exemplary embodiments thereof, it will be apparent to those of ordinary skill in the art that various changes in form and detail may be made therein without departing from the spirit and scope of the present invention as defined by the following claims.

What is claimed is:

1. A display device comprising:
a substrate;
a pixel circuit arranged to form a display area; and
a light-emitting device connected to the pixel circuit,
wherein the pixel circuit includes a first transistor having a first gate electrode and a second transistor having a second gate electrode,
wherein a lateral wall slope angle of the first gate electrode is different from a lateral wall slope angle of the second gate electrode, and
wherein the first transistor further includes a doping control member formed on a lateral wall of the first gate electrode, and wherein the doping control member is not formed on a lateral wall of the second gate electrode,
wherein the first transistor further includes a semiconductor member positioned under the first gate electrode,
wherein the semiconductor member includes a lightly doped drain formed underneath the doping control member, and
wherein a lightly doped drain is not formed on a semiconductor member of the second gate electrode.

2. The display device of claim 1,
wherein the lateral wall slope angle of the first gate electrode is between about 70 degrees and about 90 degrees, and
wherein the lateral wall slope angle is a slope angle of the lateral wall of the first gate electrode with reference to a surface of the substrate.

3. The display device of claim 1, further comprising:
a first scan line formed on the substrate and transmitting a scan signal; and
a data line crossing the first scan line and transmitting a data voltage,
wherein the second transistor is connected to the first scan line and the data line, and wherein the first transistor is connected to the second transistor.

4. The display device of claim 3, further comprising:
a third transistor connected to the first scan line and connected to the first transistor, wherein the third transistor compensates a threshold voltage of the first transistor, and wherein the third transistor is connected to the drain electrode of the first transistor and the first gate electrode.

5. The display device of claim 4,
wherein the third transistor includes a gate electrode of which a lateral wall slope angle is between about 70 degrees and about 90 degrees.

6. The display device of claim 4, further comprising:
a second scan line formed parallel to the first scan line and transmitting a previous scan signal applied before the scan signal is applied to the first scan line;
an initialization voltage line transmitting an initialization voltage initializing the first transistor; and
a fourth transistor turned on depending on the previous scan signal and transmitting the initialization voltage to the first gate electrode,
wherein the fourth transistor is positioned between the initialization voltage line and the first gate electrode.

7. The display device of claim 1,
wherein the second transistor includes a gate electrode of which the lateral wall slope angle of the gate electrode less than about 70 degrees.

8. The display device of claim 7, further comprising:
a light emission control line disposed parallel to the first scan line and transmitting a light emission control signal; and
a sixth transistor turned on by the light emission control signal.

9. The display device of claim 8, further comprising:
a bypass control line transmitting a bypass control signal; and
a seventh transistor turned on by the bypass control signal and partially bypassing a driving current transmitted by the first transistor to the initialization voltage line.

10. A display device comprising;
a substrate;
a pixel circuit arranged to form a display area; and
a light-emitting device connected to the pixel circuit,
wherein the pixel circuit includes a driving transistor having a first gate electrode and a switching transistor having a second gate electrode,
wherein a lateral wall slope angle of the first gate electrode is different from a lateral wall slope angle of the second gate electrode, and
wherein the driving transistor further includes a doping control member formed on a lateral wall of the first gate electrode, and wherein the doping control member is not formed on a lateral wall of the second gate electrode;
wherein a lightly doped drain is formed under the doping control member in the driving transistor; and
wherein a lightly doped drain is not formed on a semiconductor member of the switching transistor.

* * * * *